United States Patent
Schwartz

(10) Patent No.: US 8,014,486 B2
(45) Date of Patent: Sep. 6, 2011

(54) GENERATING A FREQUENCY SWITCHING LOCAL OSCILLATOR SIGNAL

(75) Inventor: Adam L. Schwartz, San Carlos, CA (US)

(73) Assignee: NDSSI Holdings, LLC, San Jose, CA (US)

( * ) Notice: Subject to any disclaimer, the term of this patent is extended or adjusted under 35 U.S.C. 154(b) by 795 days.

(21) Appl. No.: 12/079,471

(22) Filed: Mar. 27, 2008

(65) Prior Publication Data

US 2009/0245447 A1    Oct. 1, 2009

(51) Int. Cl.
    *H03D 3/24*    (2006.01)
(52) U.S. Cl. ........ 375/376; 375/327; 375/359; 375/362; 375/371; 375/375; 331/25; 331/34; 455/77; 455/260
(58) Field of Classification Search .......... 375/294, 375/327, 339, 344, 355, 362, 373, 374, 376, 375/350, 371, 375; 331/25, 34, 36, 167
    See application file for complete search history.

(56) References Cited

U.S. PATENT DOCUMENTS

| | | | |
|---|---|---|---|
| 5,303,259 A | 4/1994 | Loveall | |
| 5,784,413 A | 7/1998 | Chen | |
| 6,587,863 B1 | 7/2003 | Gentile et al. | |
| 6,693,980 B1 | 2/2004 | Linder et al. | |
| 7,081,844 B1 | 7/2006 | Huang et al. | |
| 7,279,994 B2* | 10/2007 | Takagi | 331/36 C |
| 7,330,079 B2* | 2/2008 | Williams et al. | 331/34 |
| 2002/0103838 A1 | 8/2002 | Kelly | |
| 2002/0110189 A1 | 8/2002 | Souissi et al. | |
| 2006/0014510 A1* | 1/2006 | Yamamoto et al. | 455/260 |
| 2007/0155343 A1* | 7/2007 | Abesingha et al. | 455/77 |
| 2009/0167401 A1* | 7/2009 | Jones et al. | 327/299 |
| 2009/0274249 A1* | 11/2009 | Okada et al. | 375/344 |
| 2011/0016346 A1* | 1/2011 | Lee et al. | 713/503 |

OTHER PUBLICATIONS

Ho et al., "Charge-Domain Signal Processing of Direct RF Sampling Mixer with Discrete-Time Filters in Bluetooth and GSM Receivers", Mar. 13, 2006, EURASIP Journal on Wireless Comm. and Networking, vol. 2006, Article ID 62905,pp. 1-14.

* cited by examiner

*Primary Examiner* — Shuwang Liu
*Assistant Examiner* — Hirdepal Singh
(74) *Attorney, Agent, or Firm* — Brian R. Short

(57) ABSTRACT

Methods and systems of generating a frequency switching local oscillator signal are disclosed. One method includes generating a reference clock signal, and clocking a counter with the reference clock signal. The counter controls selection of a one of a plurality of analog values stored in at least one of a plurality of periodic signal generators. The frequency switching local oscillator signal is generated by selecting an output of a one of the plurality of periodic signal generators.

23 Claims, 11 Drawing Sheets

Order of sample outputs for count k used to generate sinusoid of frequencies $F_l$ ($l = 1, ..., 4$)

| k | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| $F_1$ | x | $a_1$ | $a_2$ | $a_3$ | $a_4$ | $a_5$ | $a_6$ | $a_7$ | $a_8$ | $a_7$ | $a_6$ | $a_5$ | $a_4$ | $a_3$ | $a_2$ | $a_1$ |
| $F_2$ | x | $a_3$ | $a_6$ | $a_7$ | $a_4$ | $a_1$ | $-a_2$ | $-a_5$ | $-a_8$ | $-a_5$ | $-a_2$ | $a_1$ | $a_4$ | $a_7$ | $a_6$ | $a_3$ |
| $F_3$ | x | $a_5$ | $a_6$ | $a_1$ | $-a_4$ | $-a_7$ | $-a_2$ | $a_3$ | $a_8$ | $a_3$ | $-a_2$ | $-a_7$ | $-a_4$ | $a_1$ | $a_6$ | $a_5$ |
| $F_4$ | x | $a_7$ | $a_2$ | $-a_5$ | $-a_4$ | $a_3$ | $a_6$ | $-a_1$ | $-a_8$ | $-a_1$ | $a_6$ | $a_3$ | $-a_4$ | $-a_5$ | $a_2$ | $a_7$ |
| k | 16 | 17 | 18 | 19 | 20 | 21 | 22 | 23 | 24 | 25 | 26 | 27 | 28 | 29 | 30 | 31 |
| $F_1$ | x | $-a_1$ | $-a_2$ | $-a_3$ | $-a_4$ | $-a_5$ | $-a_6$ | $-a_7$ | $-a_8$ | $-a_7$ | $-a_6$ | $-a_5$ | $-a_4$ | $-a_3$ | $-a_2$ | $-a_1$ |
| $F_2$ | x | $-a_3$ | $-a_6$ | $-a_7$ | $-a_4$ | $-a_1$ | $a_2$ | $a_5$ | $a_8$ | $a_5$ | $a_2$ | $a_1$ | $-a_4$ | $-a_7$ | $-a_6$ | $-a_3$ |
| $F_3$ | x | $-a_5$ | $-a_6$ | $-a_1$ | $a_4$ | $a_7$ | $a_2$ | $-a_3$ | $-a_8$ | $-a_3$ | $a_2$ | $a_7$ | $a_4$ | $-a_1$ | $-a_6$ | $-a_5$ |
| $F_4$ | x | $-a_7$ | $-a_2$ | $a_5$ | $a_4$ | $-a_3$ | $-a_6$ | $a_1$ | $a_8$ | $a_1$ | $-a_6$ | $-a_3$ | $a_4$ | $a_5$ | $a_2$ | $a_7$ |

FIGURE 7A

Value of count $k$ *(for the first 8 counts)* for which switch $s_n$ *(n =1, ... 8)* should be closed

| switch | M = 1<br>F1 = (264 MHz) | M = 3<br>F2 = (792 MHz) | M = 5<br>F3 = (1320 MHz) | M = 7<br>F4 = (1848 MHz) |
|---|---|---|---|---|
| $s_1$ | +1 | +5 | +3 | −7 |
| $s_2$ | +2 | −6 | −6 | +2 |
| $s_3$ | +3 | +1 | +7 | +5 |
| $s_4$ | +4 | +4 | −4 | −4 |
| $s_5$ | +5 | −7 | +1 | −3 |
| $s_6$ | +6 | +2 | +2 | +6 |
| $s_7$ | +7 | +3 | −5 | +1 |
| $s_8$ | +8 | −8 | +8 | −8 |

FIGURE 7B

GENERATING A FREQUENCY SWITCHING LOCAL OSCILLATOR SIGNAL

FIELD OF THE DESCRIBED EMBODIMENTS

The described embodiments relate generally to communication systems. More particularly, the described embodiments relate to a method and apparatus for a frequency hopping transceiver.

BACKGROUND

Communication networks typically include transmission of modulated signals. The transmission of the signals is generally regulated by a standard. One characteristic of the transmission that is typically regulated is the transmission frequency (band). Some standards include multiple bands (or channels), and therefore, require transceivers that are operable over the multiple transmission bands. Generally, the transceivers frequency up-convert signals before transmission, and frequency down-convert signals after reception. The frequency conversions typically require local oscillators, and transceivers that support multiple bands require local oscillators that operate at multiple frequencies.

Examples of wireless communication systems that employ frequency hopping transceivers include unlicensed cordless phones operating according to the FCC part 15 requirements as well as OFDM (orthogonal frequency duplex multiplexing) UWB (ultra wideband) radios as defined according to the WiMedia UWB standard. Frequency hopping transceivers frequency hop between multiple transmission bands and, therefore, typically require local oscillators that can switch frequencies.

FIG. 1 shows an example of an indoor broad band wireless communication network 100 such as a UWB network. As mentioned, embodiments of WiMedia UWB networks include frequency hopping. The exemplary network 100 includes a high definition television (HDTV) monitor 110 networked with other devices, such as, a digital video recorder (DVR) 120, a digital video disk (DVD) player 140 and a computing device 130.

A prior method of providing switching frequencies includes switching the divide ratio in a phase lock loop (PLL). However, this method generally provides very slow switching times (on the order of micro- or milli-seconds). Another method includes running multiple PLLs in parallel and switching between the PLL outputs with an analog signal multiplexer. However, this method consumes significant amounts of power and results in significant leakthrough from the un-selected PLLs. Another method includes generating the LO frequency by dividing down a single high-frequency sinusoid and then re-combining the various sub-harmonics using mixers and analog signal multiplexers to create the hopping LO signal. However, this method consumes a lot of power and results in a significant number of spurious outputs. For integrated circuits, this method requires many inductors which take up significant amounts of die space.

It is desirable to provide methods and apparatuses for generation of fast frequency switching local oscillator signals. It is desirable that the methods and apparatuses be low-cost, low-power and can be implemented using minimal amounts of circuitry.

SUMMARY

An embodiment includes a method of generating a frequency switching local oscillator signal. This embodiment includes generating a reference clock signal. A counter is clocked with the reference clock signal. The counter cyclical controls selection of a one of a plurality of analog values stored in a periodic signal generator, wherein the cyclical selection produces a periodic signal at an output of the periodic signal generator. A frequency of the periodic signal at the output of the periodic signal generator is controlled by controlling an order of the selection of the plurality of analog values stored in the periodic signal generator. The frequency switching local oscillator signal is generated based on the periodic signal.

An embodiment includes another method of generating a frequency switching local oscillator signal. The method includes generating a reference clock signal, and clocking a counter with the reference clock signal. The counter controls cyclical selection of a one of a plurality of analog values stored in at least one of a plurality of periodic signal generators, wherein the cyclical selection produces a periodic signal at an output of the one of the plurality of periodic signal generators. The frequency switching local oscillator signal is generated by selecting an output of a one of the plurality of periodic signal generators.

Another embodiment includes a frequency switching local oscillator. The local oscillator includes a fixed-frequency reference clock for providing a reference clock signal. A counter receiving the reference clock signal, and controlling cyclical selection of a one of a plurality of analog values stored in a periodic signal generators, the cyclical selection producing a periodic signal at an output of the periodic signal generators. The local oscillator include means for controlling a frequency of the periodic signal at the output of the periodic signal generator by controlling an order of the selection of the plurality of analog values stored in the periodic signal generators.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIGS. 7A and 7B are tables that illustrate the order of selection of analog values for a periodic signal generator generating several different frequency sinusoids.

DETAILED DESCRIPTION

The embodiments described include apparatuses and methods for generating frequency switching local oscillator (LO) signals. The local oscillators are relatively low-cost, low-power and do not require large amounts of electronic circuitry. Embodiments include frequency switching LO signals being generated by a counter controlling selection of analog values stored inside of periodic signal generators (PSGs). Other embodiments include the LO frequency being switched by selecting between outputs of multiple PSGs.

Some communication signal standards include more than one frequency range (band or channel) of operating frequencies. Support of multiple channels requires the use of a local oscillator and/or local oscillators that frequency up-convert signals to the corresponding frequency bands (or down-convert from the corresponding frequency bands). For example, the WiMedia UWB standard includes the multiple transmission bands centered on the following frequencies:

| Band Group | Band 1 | Band 2 | Band 3 |
|---|---|---|---|
| 3 | 6600 MHz | 7128 MHz | 7656 MHz |
| 6 | 7656 MHz | 8184 MHz | 8712 MHz |
| 4 | 8184 MHz | 8712 MHz | 9240 MHz |

The LO synthesis circuit must be able to cleanly switch between the three frequencies within a band group with less than 10 nS settling time—too fast for directly switching frequencies with a single PLL.

Figure 1:
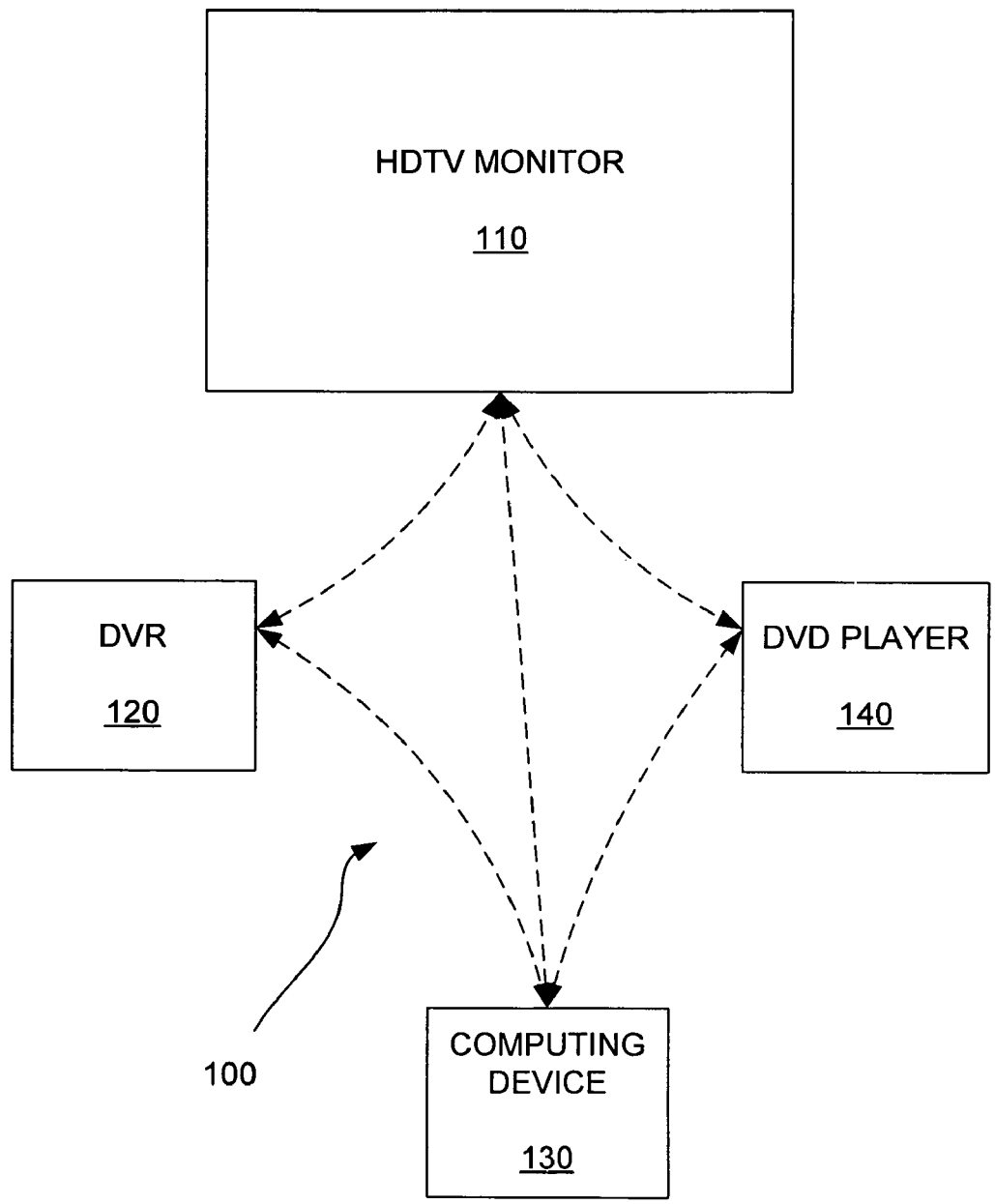
FIG. 1 shows an example of a wireless network that includes multiple transceivers.
Figure 2:
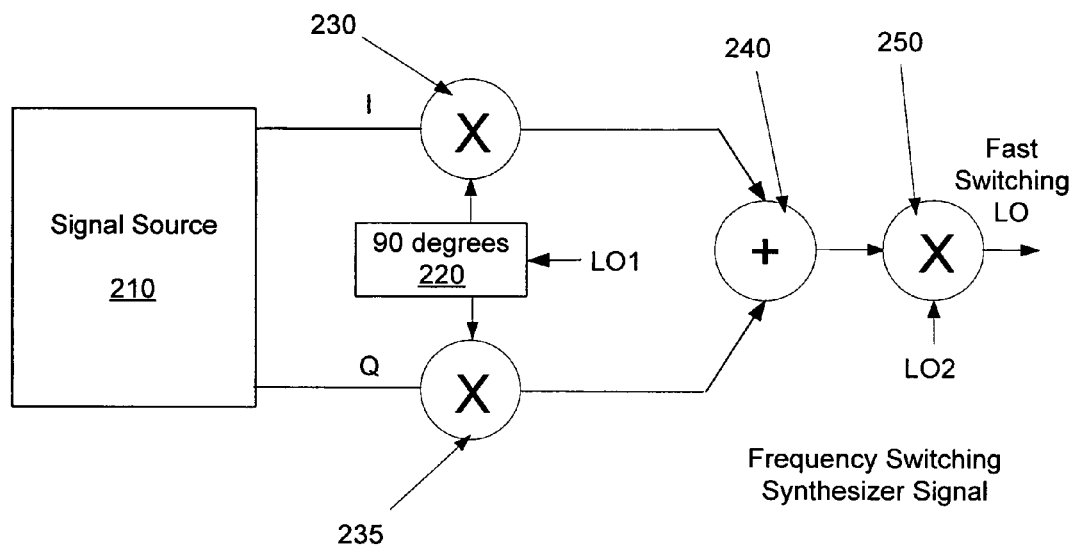
FIG. 2 shows an example of communication transceiver showing how LO signals are used to up-convert a baseband signal.

FIG. 2 shows an example of a standard communications up-converter. This embodiment includes a signal source 210. The signal source 210 generates I and Q (In-phase and Quadrature) outputs which are frequency up-converted twice, with a first $LO_1$ signal and a second $LO_2$ signal, generating the LO signal. The two frequency up-conversions require two references signals ($LO_1$, $LO_2$) and two frequency translators 230, 235 (mixers). The up-converted signals can be summed at a summer 240, and frequency converted again with a frequency translator 250, generating a fast switching LO signal. Switching of the LO can be accomplished by switching the frequencies of one or both of the reference signals $LO_1$, $LO_2$. In common practice, switching of either LO is accomplished by changing the divide ratio of a PLL. This is typically a slow process.

One approach that has been adopted for generating LO signals which can be quickly switched between different frequencies is the use of direct digital synthesis (DDS) in place of analog PLL circuits. DDS technology is very flexible in allowing generation of arbitrary waveforms and arbitrary frequencies. The general structure of a DDS includes a counter that generates addresses of a lookup table. The lookup table stores digital values that are converted to an analog waveform through a digital-to-analog converter (DAC). The flexibility of DDS technology comes at a price: the circuitry is relatively slow (limiting the maximum achievable frequency) and consumes a significant amount of power. For instance, a DDS circuit implemented in standard CMOS technology is not be able to generate the WiMedia frequencies shown above.

In order to circumvent these limitations in the prior art, the described embodiments provide a frequency switching local oscillator that does not change PLL divide ratios. The described embodiments also eliminate the need for a DAC and do not use digital look-up tables. The described embodiments include the benefits of increased speed, reduced circuit complexity, reduced power consumption and the elimination of errors due to the limited precision of digital words. The described embodiments provide significant benefits when the frequencies to be generated are of the form $(N/R \pm M)*\Delta F$ where N, R and M are integers and $\Delta F = F_{ref}/N$ is the greatest common divisor of the frequencies to be generated.

Figure 3:
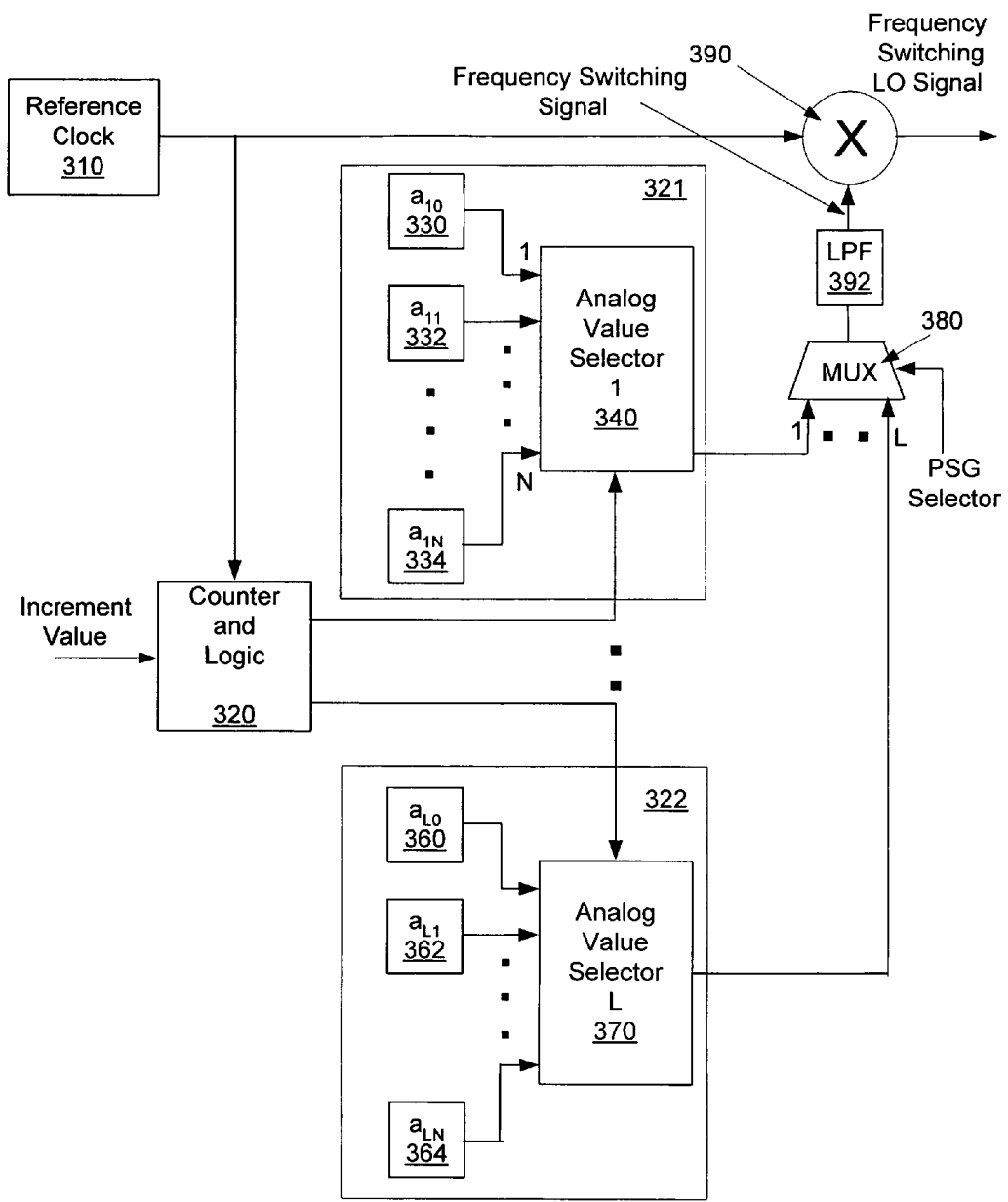
FIG. 3 shows one example of a low-cost, frequency switching local oscillator.

FIG. 3 shows one example of a low-cost, frequency switching local oscillator. This local oscillator includes L periodic signal generators (PSGs), wherein each of the PSGs is capable of producing a periodic signal. Typically, the periodic signal of each PSG has a different frequency. Each PSG includes a plurality of stored analog values and an analog value selector which directs one or more of the analog values to the output of the PSG. For instance, the stored analog values may correspond to evenly spaced samples of a periodic waveform such as a sinusoid. The periodic signals at the output of each PSG are generated by a counter which activates the analog value selector to cyclically select the stored analog values. As the analog values are selected the periodic signal is constructed. Once one period of the periodic signal is complete, the cycle of values is repeated. The means by which the counter selects different analog values through the analog value selector can include direct connection of the counter bits to the selector or intervening logic and/or multiplexers which determine the selections based on the count.

In FIG. 3, a first analog value selector 340 of the first periodic signal generator 321 receives analog values from a plurality of N analog values 330, 332, . . . 334. In operation, a periodic signal whose time samples are the analog values 330, 332, . . . 334 is generated by the first periodic signal generator by selection of the analog values 330, 332, . . . 334. The selection is controlled by the counter and logic block 320. As will be described, the frequency of the periodic signal generated by the first PSG is dependent upon the stored analog values 330, 332, . . . 334, the rate that the counter 320 makes selections through the first analog value selector 340, the increment value of the counter 320, and the order in which values are selected given the counter output.

As shown, an $L^{th}$ analog value selector 370 receives analog values from a plurality of N analog values 360, 362, . . . 364. Though the $L^{th}$ periodic signal generator is shown with the same number of analog values as the first PSG, it should be understood that the number of analog values of each of the periodic signal generators can be different. In operation, the $L^{th}$ analog value selector 370 generates a periodic signal based on the analog values 360, 362, . . . 364, and the selection of the analog values 360, 362, . . . 364 by the counter and logic block 320.

As shown, the counter 320 receives and counts a reference clock signal generated by a reference clock 310. The reference clock can be any standard signal generation reference clock such as a crystal oscillator or PLL. The number of control signals provided by the counter 320 to the analog value selectors is generally dependent upon the number of analog values stored within each of the corresponding periodic signal generators and how many different frequencies will be generated.

For an embodiment, the fast frequency switching of the local oscillator output is provided by using the multiplexer 380 to switch between outputs of the PSGs (321, 322 and other PSGs not shown in the diagram). Since each of the plurality of PSGs generates different frequencies, the frequency of the multiplexer output switches when it switches its selection of the outputs of the plurality of PSGs. Low pass filter 392 is included at the output of the multiplexer 380. The multiplexer 380 is controlled by a PSG selector.

It should be noted that some embodiments include the frequency switching signal at the output of the low pass filter 392 as the frequency switching local oscillator signal. That is, the frequency switching local oscillator is a one of the periodic signals generated by the one of the plurality of periodic signal generators.

For the embodiment of FIG. 3, the frequency switching signal is used to frequency translate the reference clock signal using a mixer 390 to generate the frequency switching LO signal. This means that the frequency switching signal and the reference clock signal are multiplied together to produce a frequency which is the sum (and difference) of their two frequencies. Typically a circuit element called a mixer is used to carry out the frequency translation. As will be described, the reference clock signal can be frequency divided before the frequency translation by the frequency switching signal.

As can be observed in FIG. 3, L is the number of generated frequencies, N is the number of samples in a base period (the base period is one period of the lowest frequency (shown in FIG. 8)), and M is a variable for determining the specific frequency of the generated periodic signal.

Figure 4:
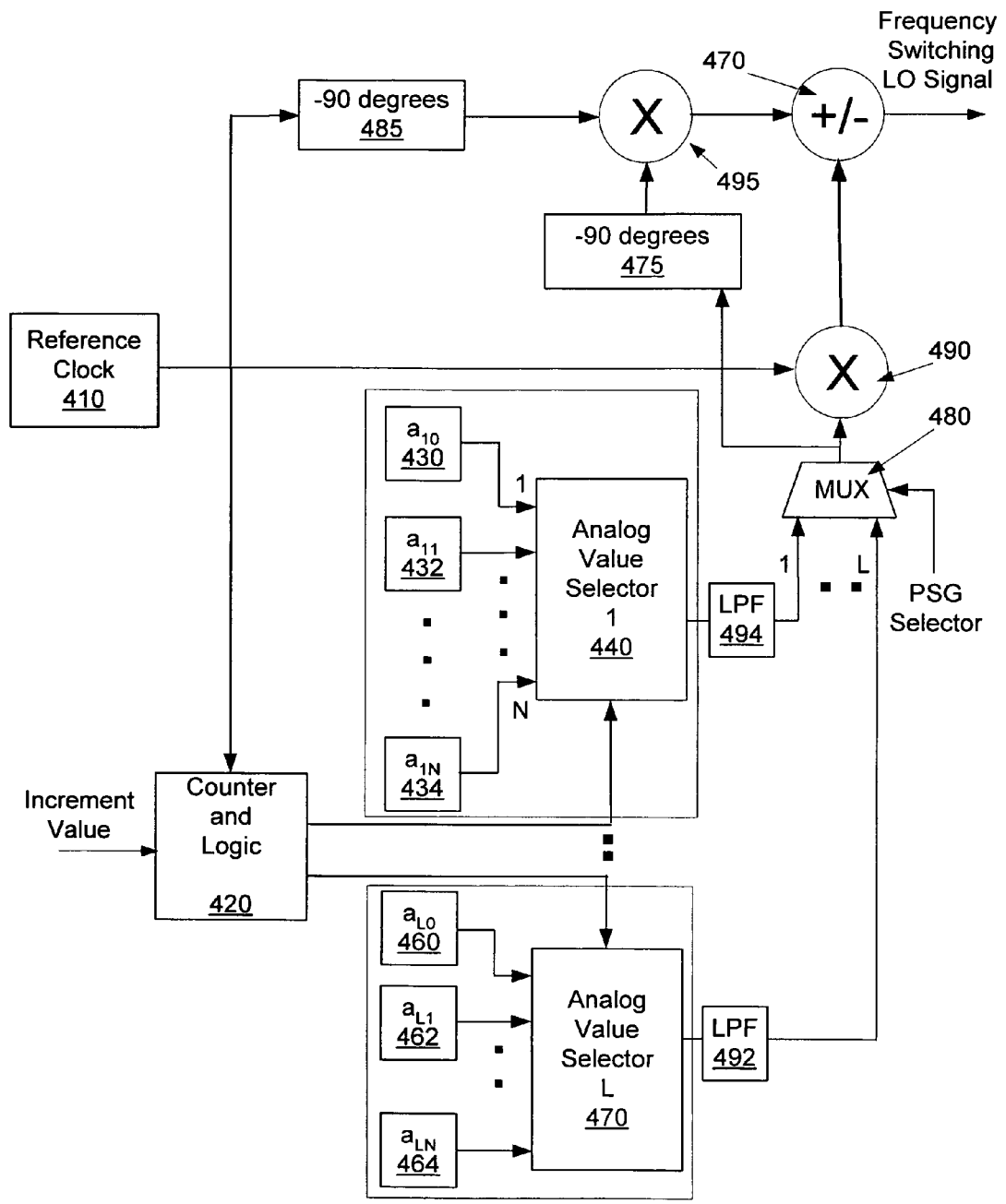
FIG. 4 shows another example of a low-cost, frequency switching local oscillator including a quadrature mixer.

FIG. 4 shows another example of a low-cost, frequency switching local oscillator that includes a quadrature mixer. The use of the quadrature mixer structure (consisting of summer 470, phase shifter 475, phase shifter 485, frequency mixer 490 and frequency mixer 495) allows the frequency at which the analog values are read out to be much lower. Also FIG. 4 shows that the low pass filters 492, 494 can be alternatively located at the outputs of the PSGs rather than at the output of the multiplexer 480. For example, if the reference clock is chosen as 8448 MHz, then the WiMedia frequencies given above can be generated with the following frequencies for the frequency switching signal:

| Band Group | Band 1 | Band 2 | Band 3 |
| --- | --- | --- | --- |
| 3 | −1848 MHz | −1320 MHz | −792 MHz |
| 6 | −792 MHz | −264 MHz | +264 MHz |
| 4 | −264 MHz | +264 MHz | +792 MHz |

The negative frequencies are generated by using the lower sideband output of the quadrature mixer while the positive frequencies are generated by using the upper sideband output of the quadrature mixer. Notice that, in fact, all of the WiMedia frequencies are generated from just four frequency switching signal frequencies. These frequencies have the form $(N/R \pm M)*\Delta F$ where $\Delta F = F_{ref}/N = 8448$ MHz/32=264 MHz, R=1 and M=1, 3, 5, or 7.

In FIG. 4, a first analog value selector 440 of the first periodic signal generator receives analog values from a plurality of N analog values 430, 432, . . . 434. In operation, a periodic signal whose time samples are the analog values 430, 432, . . . 434 is generated by the first periodic signal generator by selection of the analog values 430, 432, . . . 434. The selection is controlled by the counter and logic block 420. As will be described, the frequency of the periodic signal generated by the first PSG is dependent upon the stored analog values 430, 432, . . . 434, the rate that the counter 420 makes selections through the first analog value selector 440, the increment value of the counter 420, and the order in which values are selected given the counter output.

An $L^{th}$ analog value selector 470 receives analog values from a plurality of N analog values 460, 462, . . . 464. Though the $L^{th}$ periodic signal generator is shown with the same number of analog values as the first PSG, it should be understood that the number of analog values of each of the periodic signal generators can be different. In operation, the $L^{th}$ analog value selector 470 generates a periodic signal based on the analog values 460, 462, . . . 464, and the selection of the analog values 460, 462, . . . 464 by the counter and logic block 420.

The counter 420 receives and counts a reference clock signal generated by a reference clock 410. The reference clock can be any standard signal generation reference clock such as a crystal oscillator or PLL. The number of control signals provided by the counter 420 to the analog value selectors is generally dependent upon the number of analog values stored within each of the corresponding periodic signal generators and how many different frequencies will be generated.

Again, it should be noted that some embodiments include the frequency switching local oscillator signal being the output signal of, for example, the multiplexer 480.

Figure 5:
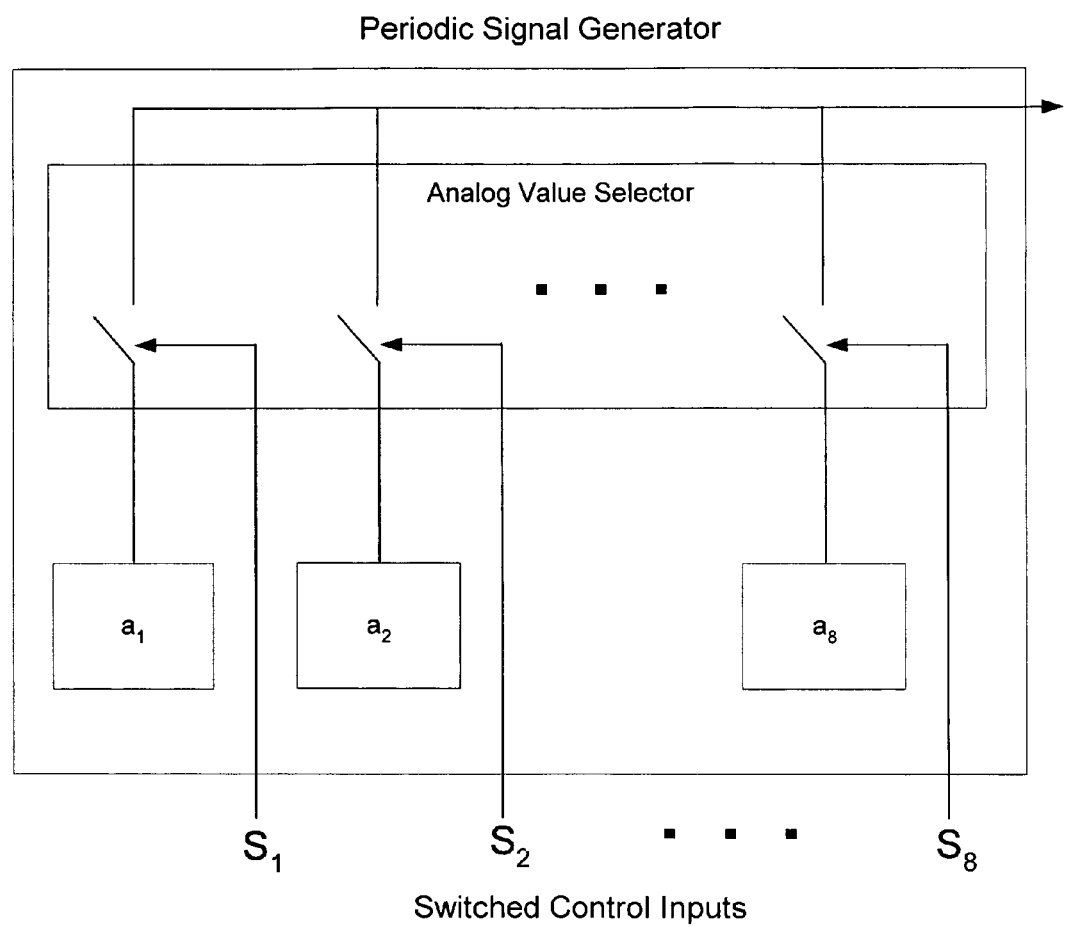
FIG. 5 shows one example of how analog values are switched to the output of a periodic signal generator.

FIG. 5 shows one example of a periodic signal generator with analog values $a_1, a_2, \ldots, a_8$. The analog values can be current sources or voltage sources. The switch control inputs $s_1, s_2, \ldots, s_8$ each cause one switch to close (however, other embodiments can close multiple switches) directing an analog value to the output of the periodic signal generator. Cyclical activation of the switch controls causes a periodic signal at the output of the PSG whose frequency depends upon the analog values, the order the analog values are selected and the rate at which the analog values are selected.

Figure 6:
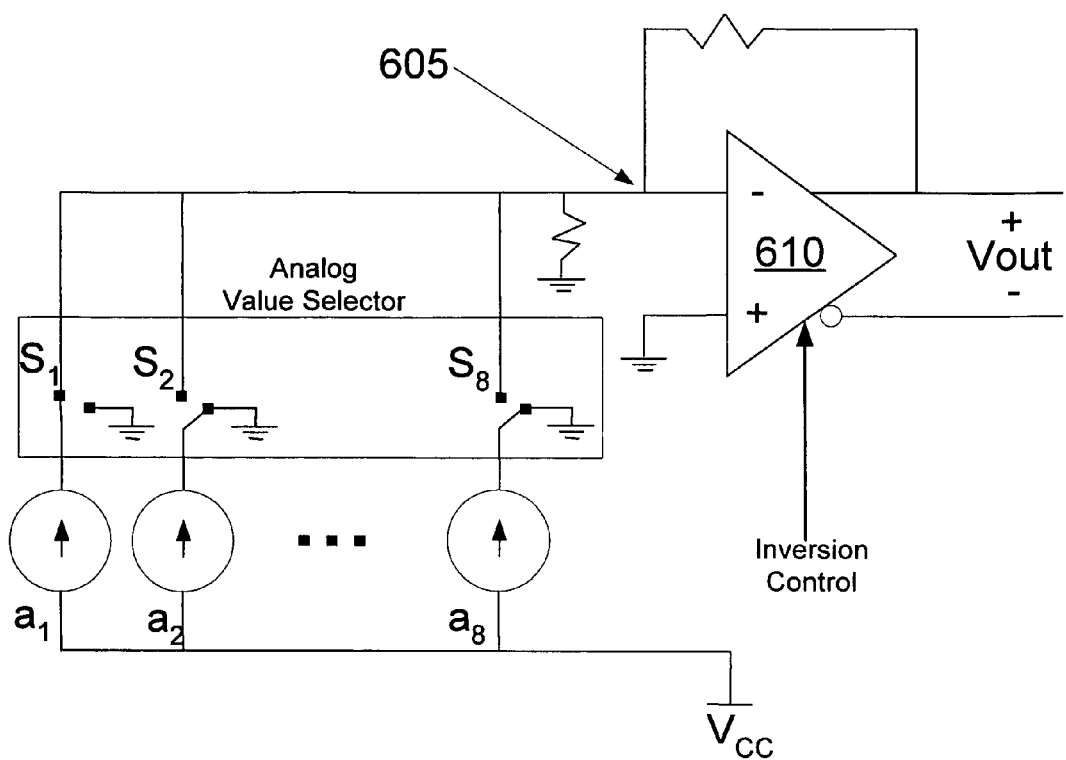
FIG. 6 shows a more detailed example of an embodiment of a periodic signal generator.

FIG. 6 show an example of a more detailed embodiment of a periodic signal generator (PSG). It shows a plurality of current sources $a_1$-$a_8$ (eight is chosen for demonstration purposes) that are controllably switched in or out of a summing junction 605 of an op-amp 610. Here, the current sources implement the analog values. Clearly, the magnitude of the current provided to the summing junction 605 determines a magnitude of the output (Vout) of the op-amp 610. Although a voltage output is indicated it is also possible for the PSG to generate a current output. As shown, the switches $s_1$-$s_8$ are selectively opened or closed to direct the corresponding current to the summing junction in order to generate the desired output (Vout). For instance, if switch $s_3$ is closed, the analog value $a_3$ will appear at the output. As described earlier, the selections are controlled by a counter that cyclically selects a different one of the analog values (current sources) $a_1$-$a_8$. The cyclical selection of analog values generates a periodic signal at the output of the op-amp 610. The output can be inverted by an inversion control of the op-amp 620. Typically, a differential output, as shown in FIG. 6, is used. But the same results can be obtained using a single-ended output.

An embodiment of the PSG includes the analog values implemented with current sources which are fixed or programmable in hardware. Another embodiment includes the analog values implemented with voltages set by resistive voltage dividers. The resistive divided ratios can be fixed or programmable in hardware.

One embodiment includes choosing the analog values, $a_k$, and the state of the switches $s_k$, for implementation of a thermometer-like coded representation. For clarity of presentation the descriptions which follow are based on the example of WiMedia frequencies given above in which the switching frequencies take the form $(N/R \pm M)*\Delta F$ with N=32 and $\Delta F$=264 MHz, R=1 and M=1, 3, 5, or 7. In other words, the reference clock operates at 8448 MHz and each period output is generated with 32 samples. The reference clock frequency and the number of samples are also only given for the sake of presentation. Other values are possible.

For a sinusoid of frequency F the analog values using 32 samples can be chosen as $$I_k = \begin{cases} 0 & \text{for } k = 0 \\ \sin\left(2\pi F \frac{k}{32}\right) - \sin\left(2\pi F \frac{(k-1)}{32}\right) & \text{for } k = 1, \ldots, 31 \end{cases}$$

The counter counts modulo 32 at the 8448 MHz rate of the reference clock and the desired samples are obtained by closing the switches one at a time as the count increments. Specifically, at sample time k−1 switches $s_1, \ldots, s_{k-1}$ are closed and at the next sample time k the next switch $s_k$ is closed. At k=0 all switches are open. In this approach, each of the L frequencies is generated by its own periodic signal generator as shown in FIGS. 3 and 4, and each PSG stores 32 analog values (or 31 since the value of 0 can be generated by opening all switches in the PSG).

However, it is possible to generate the multiple frequencies with a single PSG if the periodic signals are sinusoids (or other symmetric signals such as triangle waves) and each analog value represents samples of the sinusoid, so long as the frequencies bear a simple relationship to each other. For example, if the periodic signals are of the form $$\sin\left(2\pi \frac{Mk}{32}\right),$$

all the output values can be generated with a single set of samples:

$$a_k = \sin\left(2\pi \frac{k}{32}\right), k = 0, \ldots, 31.$$

Again, 32 samples is used simply to provide a concrete example. In no way should this be interpreted to limit the described embodiments to 32 samples. In fact, all of the required samples can be generated with only eight analog values because $$a_k = \begin{cases} a_{16-k} & \text{for } k = 8, \ldots, 15 \\ -a_{k-16} & \text{for } k = 16, \ldots, 23. \\ -a_{32-k} & \text{for } k = 24, \ldots, 31 \end{cases}$$

FIGS. 5 and 6 show periodic signal generators which contain eight analog values. Since there are eight analog values $a_1, \ldots, a_8$ in this example, there are eight switches $s_1, \ldots, s_8$ in the PSG.

Figure 8:
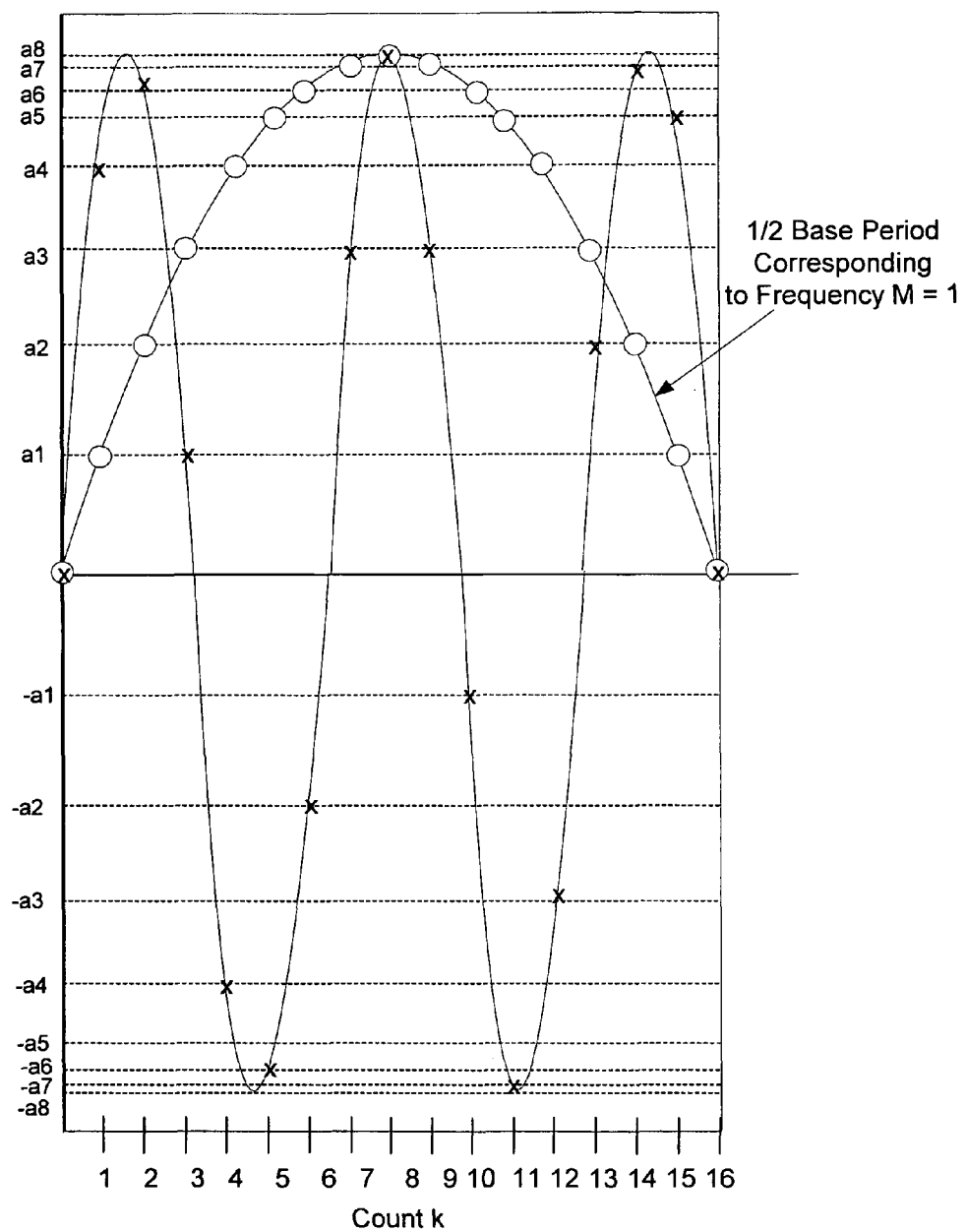
FIG. 8 shows exemplary periodic signals generated by a periodic signal generator.

To be concrete, suppose there are four desired frequencies $F_1, F_2, F_3$ and $F_4$ which correspond to M=1, 3, 5, 7. With the analog values set to $$a_k = \sin\left(2\pi \frac{k}{32}\right),$$

k=1, . . . , 8, the four sinusoids can be produced by sequencing through the analog values as show in FIG. 8. In what follows, the period of the sinusoid with M=1 is referred to as the base period. For clarity, FIG. 8 shows only two frequencies (M=1 and M=5) and only the first half of the base period is shown. Each of the 'O' marks indicate the analog values which correspond to the first sinusoid (M=1) and the 'x' marks correspond to the analog values of the second sinusoid (M=5). The samples are the amplitudes of the sinusoids at the sampling instances k=0, 1, . . . , 16 (the remaining instances of the base period, k=17, . . . , 31 are not shown). The dotted horizontal lines demonstrate that the samples of the second sinusoid are, in fact, the same as the samples of the first sinusoid. The only difference is that the samples occur in different order for the different sinusoids. Thus, all of these sinusoids can be generated using a single periodic signal generator (such as, shown in FIG. 5 or 6) containing only eight analog values. The different frequencies are produced just by reading out the samples in different sequences.

To understand more clearly how different frequencies are generated by sequencing through the analog values in different orders, FIG. 7A presents the order of samples for the four sinusoids in the above example corresponding to M=1, 3, 5 and 7. These frequencies are labeled $F_1, F_2, F_3$ and $F_4$. The table shows the appropriate analog value to generate for each frequency as a function of the sample time k. For instance, if frequency $F_3$ is being generated, then at time k=26, the analog value $a_2$ would be directed to the output of the periodic signal generator. As shown in the table of FIG. 7A, an 'x' indicates that all switches are open which results in an amplitude of zero. A negative value indicates that the negative of the analog value should be output. Alternatively, an additional set of negative analog values could be stored.

Examining FIG. 7A, one notices that the values for the first N/4 sampling instances, k=1, . . . , 8, can be generated by closing the switches $s_k$ in the periodic signal generator according to the schedule in FIG. 7B (all switches open for k=0). FIG. 7B is a table that indicates in what order the switches $s_k$ should be closed in order to generate the samples corresponding to any of the four sinusoids listed in the table. For instance, for frequency $F_2$ (M=3), switch $s_7$ should be closed when the count is k=3. The entries in FIG. 6B are determined from inspection of the table in FIG. 7A. For instance, the entry for M=3, switch 7 in FIG. 7B is determined by looking at the row for $F_2$ in FIG. 7A and seeing that when k=3, the analog value $a_7$ should be generated.

Again, the only difference in generating the various frequencies is the order in which the values are sequenced. For the remainder of the counts (k=9, . . . , 31), the state $S^N$=($s_1$, $s_2, \ldots, s_{N/4}$ of the eight switches in the PSG at time k is determined according to the relationship given earlier:

$$S_k^N = \begin{cases} S_{N/2-k}^N & k = N/4, \ldots, N/2 - 1 \\ -S_{k-N/2}^N & k = N/2, \ldots, 3N/4 - 1 \\ -S_{N-k}^N & k = 3N/4, \ldots, N \end{cases}.$$

The notation $s_k^N$ is short-hand for the state of the switches at time k for a base period with N samples. In general, if the period signal possess sufficient symmetry then if N is even, only N/2 of the analog values need to be stored and if N is a multiple of four, only N/4 analog values need to be stored.

Therefore, to generate all of the frequencies in this example it is sufficient to build a logic circuit which, in combination with logic to be described, counts up and down between 0 and 8 and forces the output to be inverted every other complete up/down cycle (which is half of the base period). The minus sign for k=16, . . . , 31 (the second half of the base period) is affected by the inversion control input to the op-amp as shown in FIG. 6.

Another important aspect of table 7B is that each switch is activated exactly once during each quarter of the base period. This enables a very simple implementation of the logic circuitry used to actuate the switches in the PSG. This property does not always hold. A simple modification presented below can deal with cases in which one or more switches will be activated more than once during a quarter of the base period.

Figure 9:
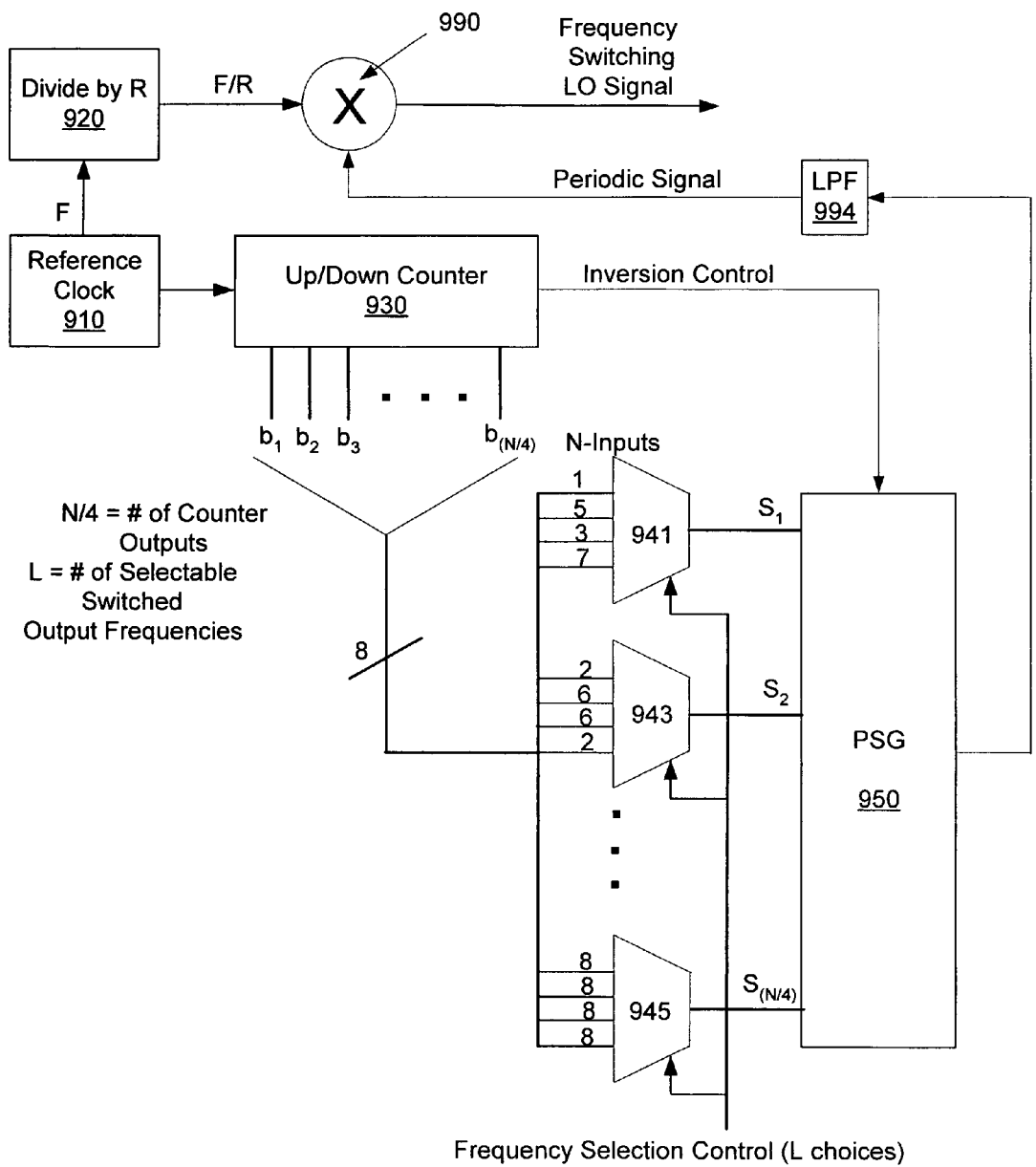
FIG. 9 shows an example of an embodiment of a low-cost, frequency switching local oscillator utilizing a single periodic signal generator.

FIG. 9 shows an example of an embodiment for generating a frequency switching LO signal which takes advantage of the structure just described. The specific numbers included in FIG. 9 correspond to the example just provided. However, other numbers might be necessary in other embodiments. The embodiment includes an up/down counter 930 to generate counter bits $b_1, b_2, \ldots, b_{N/4}$. In this case, N/4=8. Each of the outputs bits is active for one value of the count. For instance, it may be the case that $b_1$ is active when the count is 1, $b_2$ is active when the count is 2 and so forth. It should be noted that there are many equivalent ways of accomplishing the same ends with various counter and output logic configurations. For instance, a standard 3-bit counter (which counts to $2^3$=8) can be used and the counter bits can be decoded to produce the eights $b_1, \ldots, b_8$. Of course, more bits can be used if more analog values are stored.

The counter is clocked by a reference clock signal of a reference clock 910. A different subset of the N/4=8 output bits of the counter are connected to each of N/4 different multiplexers 941, 943, 945. The number of bits in each subset equals the number L of frequencies being generated. One example includes each of N/4 multiplexer 941, 943, 945 receiving a different of eight subsets of eight counter outputs, wherein each subset includes four of the eight counter output bits. For example, FIG. 9 shows each of the subsets being of size four, and therefore, provides selection and generation of periodic signals having four different frequencies. The purpose of the multiplexers is to choose which bit of each subset is connected to the PSG 950. The choice determines the frequency $F_1, F_2, \ldots, F_L$ that is generated. The subsets of bits which connect through the multiplexer are determined by the mapping shown in FIG. 7B and described above. The bits in these subsets control when each of the switches is activated and, hence, which analog values are produced by the PSG 950 and when. For instance, when it is desired to generate $F_2$, the multiplexers select their second input. Referring to FIG. 5 this means that switch $s_1$ is activated whenever the $5^{th}$ bit of the up/down counter is set, switch $s_2$ is activated whenever the $6^{th}$ bit of the up/down counter is set, and so on.

The embodiment shown includes outputs of the multiplexers 941, 943, 945 selecting a one of N/4 analog value values stored within the PSG 950 through the activation of switch control lines $s_1, s_2 \ldots s_{N/4}$. That is, the PSG 950 includes eight different analog values which are selected by the selection lines $s_1, s_2 \ldots s_{N/4}$. As shown, each multiplexer 941, 943, 945 receives a selection control input which is generated by logic coupled to the counter 930, the selection control input causes the multiplexers 941, 943, 945 to direct one of their four inputs to their outputs. This embodiment further includes only a single one of the selections $s_1, s_2 \ldots s_{N/4}$ being active per cycle of the reference clock signal.

As shown in FIG. 9, the output of the PSG is smoothed with low-pass filter 994 (described further below). The smoothed signal is the periodic signal. In this embodiment the reference clock signal is frequency divided by R (block 920) to produce a frequency divided reference clock signal. The frequency divided reference clock signal is frequency translated (with frequency translator 990) by the periodic signal, generating the frequency-switching LO signal. Another embodiment includes a quadrature mixer as the frequency translating element. Such an embodiment includes the phase-shifted frequency switching local oscillator signal being generated by a second periodic signal generators which generate the same periodic signals as the first periodic signal generators but shifted by a number of samples.

Finally, notice that the number of times per quarter base period (e.g. k=1, . . . , 8) in which any switch may be activated is equal to the number of frequencies being generated in the example provided. However, this is not always the case. For instance, if M is even not all of the analog values from the base sinusoid (M=1) will be used and the values that are used might be occur more than once in a quarter base period. Consider, for instance, the frequency generated for M=4. For this frequency, only the analog values $a_2, a_4, a_6$ and $a_8$ (and their negatives) are used. Correspondingly, during the first quarter base period switch $s_2$ is closed when k=2 and 7, $s_4$ is closed when k=2 and 6, $s_6$ is closed when k=3 and 5 and $s_8$ is closed when k=4. In such a situation in which one or more switches closes multiple times during a quarter base period the bits corresponding to those times will be OR'd together and the output of the OR logic will be presented to the multiplexers 941, 943, . . . , 945.

It should be noted that this description has concentrated on the situation in which only N/4 analog values are stored. The described embodiments are less beneficial, but equally valid, if more analog values are stored. In some case, the periodic signal may not have enough symmetry to allow only N/4 values to be stored. In such a case, obviously more values need to be stored.

Also shown in FIGS. 3, 4, 9 are low-pass filters which are used to smooth the outputs of the periodic signal generators. The cutoff of the low-pass filter is higher than the maximum generated frequencies and lower than the lowest alias frequency. In the example given above, the sample frequency is 8448 MHz. So the Nyquist rate is 4224 MHz. The highest frequency generated by the PSG is 1848 MHz. Hence the lowest alias frequency will by 6600 MHz. Thus, the smoothing filter must pass frequencies up to 1848 MHz and reject frequencies 6600 MHz and higher.

Figure 10:
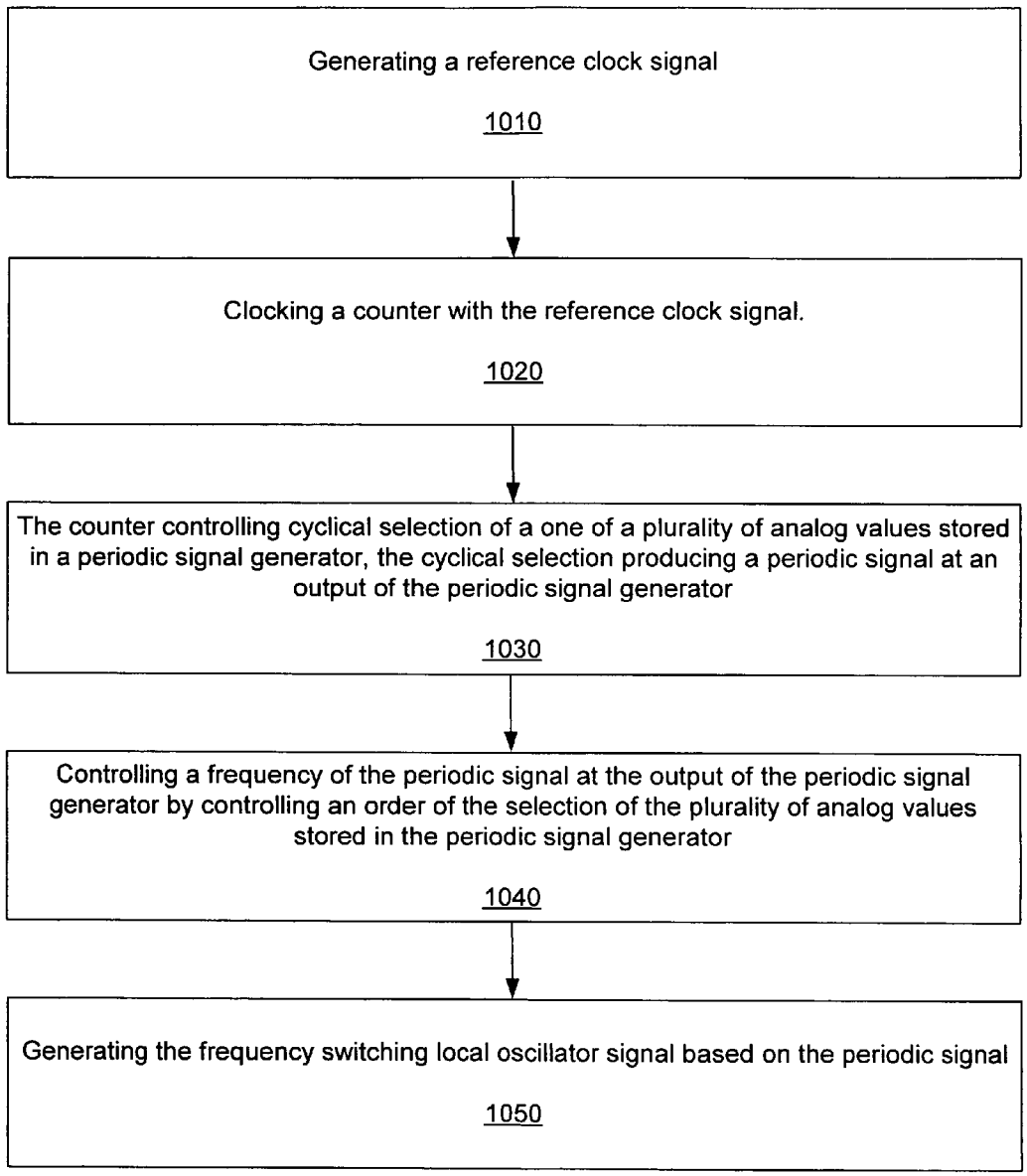
FIG. 10 is a flow chart that includes steps of one example of an embodiment of a method of generating a frequency switching local oscillator signal.

FIG. 10 is a flow chart that includes steps of one example of an embodiment of a method of generating a frequency switching local oscillator signal. A first step 1010 includes generating a reference clock signal. A second step 1020 includes clocking a counter with the reference clock signal. A third step 1030 includes the counter controlling cyclical selection of a one of a plurality of analog values stored in a periodic signal generator, the cyclical selection producing a periodic signal at an output of the periodic signal generator. A fourth step 1040 includes controlling a frequency of the periodic signal at the output of the periodic signal generator by controlling an order of the selection of the plurality of analog values stored in the periodic signal generator. A fifth step 1050 includes generating the frequency switching local oscillator signal based on the periodic signal.

In one embodiment, the periodic signal is the frequency switching local oscillator signal. In another embodiment, the frequency switching local oscillator is one of a plurality of periodic signals generated by one of a plurality of PSG(s). For another embodiment, the frequency switching local oscillator signal is the periodic signal after being frequency translated.

For an embodiment, controlling the order of selection includes directing each of a different plurality of subsets of counter bits to the switch control lines of the periodic signal generator, and choosing one counter bit from each of the subsets. A more specific embodiment includes a size of the subsets determining a number of available frequencies that can be generated by the periodic signal generator.

The number of periodic signal generators can be increased to more than one. More specifically, an embodiment includes generating a frequency switching local oscillator signal by selecting an output of one of a plurality of periodic signal generators.

Another embodiment includes generating the frequency switching local oscillator signal by frequency translating the reference clock signal with the periodic signal. An alternate embodiment includes generating the frequency switching local oscillator signal by frequency dividing the reference clock signal, and frequency translating the frequency divided reference clock signal with the periodic signal.

As previously described, the number of stored analog values can be less than the number of sample provided at the output of a periodic signal generator to provide the periodic output signal of the periodic signal generator. That is, N/2 analog values can be provided, wherein, for example, each analog value is selected twice per period of the output signal of the periodic signal generator. That is, one embodiment includes the periodic signal generator storing N/2 samples of N samples of one period of a periodic signal, and generating the N samples of the periodic signal by inverting every other repetition of the N/2 samples. Another embodiment includes the periodic signal generator storing N/4 samples of N samples of one period of a periodic signal, and generating the N samples of the periodic signal by the counter controlling selection of the stored values in an appropriate order and inverting other repetition of N/2 samples.

Another embodiment further includes generating a phase-shifted reference clock from the reference clock, and generating a phase-shifted periodic signal that is phase shifted relative to the periodic signal. The phase-shifted reference clock is frequency translated with the phase-shifted periodic signal. The local oscillator signal is generated by summing the frequency translated reference clock signal and the frequency translated phase-shifted reference clock. Additionally, the phase-shifted periodic signal can be generated by a second plurality of periodic signal generators. An embodiment includes the second plurality of periodic signal generators generating the same periodic signals as the first plurality of periodic signal generators but shifted by a number of samples. A specific embodiment includes the second plurality of periodic signal generators shifting the periodic signals be N/4 samples.

Figure 11:
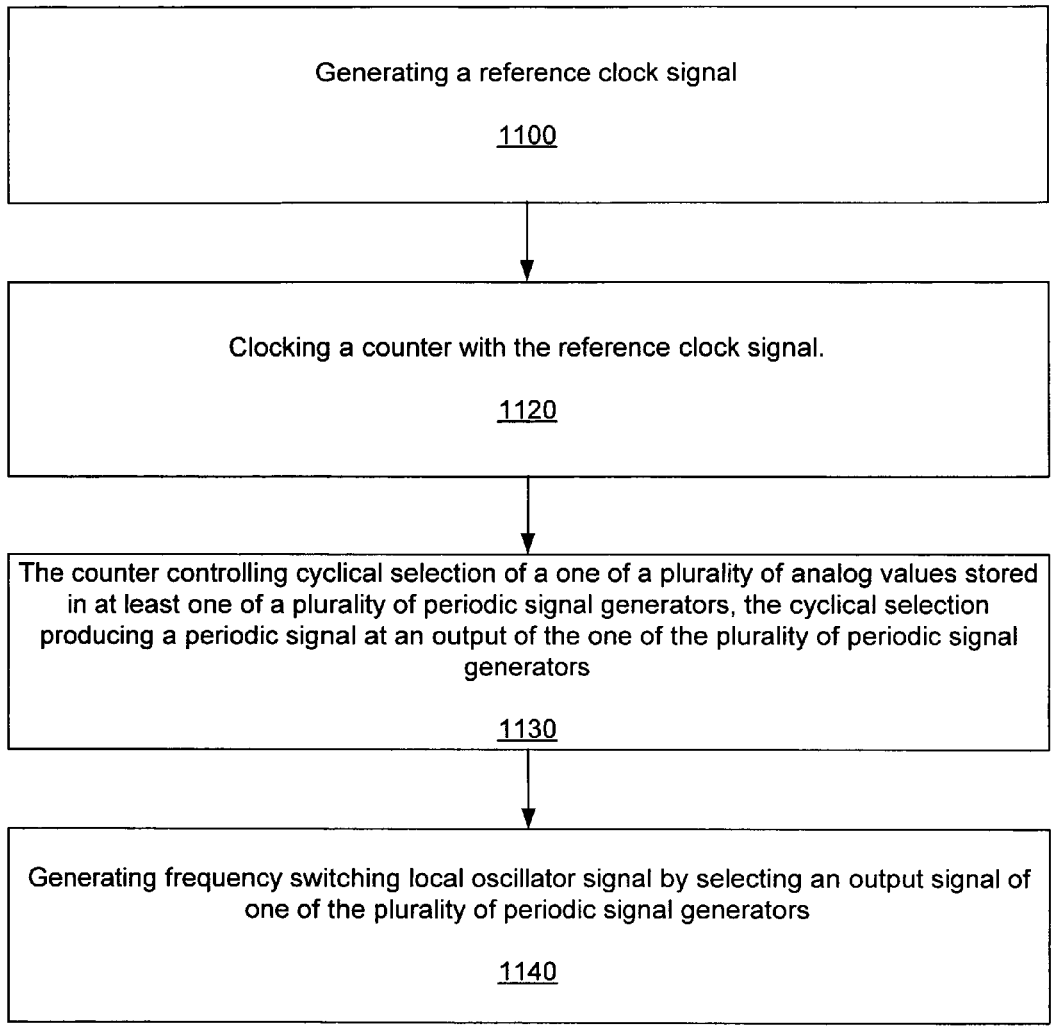
FIG. 11 is a flow chart that includes steps of one example of an embodiment of a method of generating a frequency switching local oscillator signal.

FIG. 11 is a flow chart that includes steps of one example of an embodiment of a method of generating a frequency switching local oscillator signal. A first step 1110 includes generating a reference clock signal. A second step 1120 includes clocking a counter with the reference clock signal. A third step 1130 includes the counter controlling cyclical selection of a one of a plurality of analog values stored in at least one of a plurality of periodic signal generators, the cyclical selection producing a periodic signal at an output of the one of the plurality of periodic signal generators. A fourth step 1140 includes generating a frequency switching local oscillator signal by selecting an output signal of one of the plurality of periodic signal generators.

An embodiment includes each of the plurality of periodic signal generators generating a signal at its output having a frequency different than signals at outputs of each of the other of the plurality of periodic signal generators.

Another embodiment includes generating a second frequency switching local oscillator signal by frequency translating the reference clock signal with the frequency switching local oscillator signal. An alternate embodiment includes generating a second frequency switching local oscillator signal by frequency dividing the reference clock signal, and frequency translating the frequency divided reference clock signal with the frequency switching local oscillator signal.

As previously described, the number of stored analog values can be less than the number of samples provided at the output of a periodic signal generator. That is, N/2 analog values can be provided, wherein, for example, each analog value is selected twice per period of the output signal of the periodic signal generator. That is, one embodiment includes at least one of the plurality of periodic signal generators storing N/2 samples of N samples of one period of a periodic signal, and generating the N samples of the periodic signal by inverting every other repetition of the N/2 samples. Another embodiment includes at least one of the plurality of periodic signal generators storing N/4 samples of N samples of one period of a periodic signal, and generating the N samples of the periodic signal by the counter controlling selection of the stored values in an appropriate order and inverting other repetition of N/2 samples.

As previously described, another embodiment includes controlling a frequency of a periodic signal of at least one of the plurality of periodic signal generators by adjusting an increment value of the counter.

As previously described, another embodiment includes controlling a frequency of the periodic signal at the output of at least one of the plurality of periodic signal generators, by controlling an order of the selection of the plurality of analog values stored in the at least one of the plurality of periodic signal generators. For an embodiment, controlling the order of selection includes directing each of a different plurality of subsets of counter bits to the switch control lines of the at least one periodic signal generator, and choosing one counter bit from each of the subsets. For an embodiment, a size of the subsets determines a number of available frequencies that can be generated by the at least one periodic signal generator.

As previously described, embodiment include setting the analog values by setting a value of current for each of the plurality of analog values, and/or setting the analog values by setting a value of voltage for each of the plurality of analog values.

Another embodiment further includes generating a phase-shifted reference clock from the reference clock, and generating a phase-shifted frequency switching local oscillator signal that is phase shifted relative to the frequency switching local oscillator signal. The phase-shifted reference clock is frequency translated with the phase-shifted frequency switching local oscillator signal. A third frequency switching local oscillator is generated by summing the frequency translated reference clock signal and the frequency translated phase-shifted reference clock. Additionally, the phase-shifted frequency switching local oscillator signal can be generated by a second plurality of periodic signal generators.

Although specific embodiments have been described and illustrated, the embodiments are not to be limited to the specific forms or arrangements of parts so described and illustrated.

What is claimed:

1. A method of generating a frequency switching local oscillator signal, comprising:
   generating a reference clock signal;
   clocking a counter with the reference clock signal;
   the counter controlling cyclical selection of a one of a plurality of analog values stored in a periodic signal generator, the cyclical selection producing a periodic signal at an output of the periodic signal generator;
   controlling a frequency of the periodic signal at the output of the periodic signal generator by controlling an order of the cyclical selection of the plurality of analog values stored in the periodic signal generator;
generating the frequency switching local oscillator signal based on the periodic signal; wherein
controlling the order of cyclic selection comprises directing each of a different plurality of subsets of counter bits to switch control lines of the periodic signal generator, and choosing one counter bit from each of the subsets.

2. The method of claim 1, wherein a size of each of the subsets determines a number of available frequencies of the periodic signal that can be generated by at least one periodic signal generator.

3. The method of claim 1, further comprising generating the frequency switching local oscillator signal by selecting an output of one of a plurality of periodic signal generators.

4. The method of claim 3, further comprising generating the frequency switching local oscillator signal by frequency translating the reference clock signal with the periodic signal.

5. The method of claim 3, further comprising generating the frequency switching local oscillator signal by frequency dividing the reference clock signal, and frequency translating the frequency divided reference clock signal with the periodic signal.

6. The method of claim 1, further comprising the periodic signal generator storing N/2 samples of N samples of one period of the periodic signal, and generating the N samples of the periodic signal by the counter controlling selection of the stored values in an appropriate order and inverting every other repetition of the N/2 samples.

7. The method of claim 1, further comprising the periodic signal generator storing N/4 samples of N samples of one period of the periodic signal, and generating the N samples of the periodic signal by the counter controlling selection of the stored values in an appropriate order and inverting every other repetition of N/2 samples.

8. The method of claim 4, wherein frequency translation further comprises:
generating a phase-shifted reference clock from the reference clock;
generating a phase-shifted periodic signal that is phase shifted relative to the periodic signal;
frequency translating the phase-shifted reference clock with the phase-shifted periodic signal;
generating the frequency switching local oscillator signal by summing the frequency translated reference clock signal and the frequency translated phase-shifted reference clock signal.

9. The method of claim 8, wherein the phase-shifted frequency switching local oscillator signal is generated by a second periodic signal generator which generates similar periodic signals as the periodic signal generator but shifted by a number of samples.

10. The method of claim 1, further comprising:
setting the analog values by setting a value of current for each of the plurality of analog values.

11. The method of claim 1, further comprising:
setting the analog values by setting a value of voltage for each of the plurality of analog values.

12. A method of generating a frequency switching local oscillator signal, comprising:
generating a reference clock signal;
clocking a counter with the reference clock signal;
the counter controlling cyclical selection of a one of a plurality of analog values stored in at least one of a plurality of periodic signal generators, the cyclical selection producing a periodic signal at an output of the at least one of the plurality of periodic signal generators;
generating a frequency switching local oscillator signal by selecting the output signal of the at least one of the plurality of periodic signal generators;
and further comprising the at least one of the plurality of periodic signal generators storing N/2 samples of N samples of one period of a periodic signal, and generating the N samples of the periodic signal by the counter controlling selection of the stored values in an appropriate order and inverting every other repetition of the N/2 samples.

13. The method of claim 12, further comprising generating a second frequency switching local oscillator signal by frequency dividing the reference clock signal, and frequency translating the frequency divided reference clock signal with the frequency switching local oscillator signal.

14. The method of claim 12, further comprising the at least one of the plurality of periodic signal generator storing N/4 samples of N samples of one period of a periodic signal, and generating the N samples of the periodic signal by the counter controlling selection of the stored values in an appropriate order and inverting every other repetition of N/2 samples.

15. The method of claim 12, further comprising:
controlling a frequency of a periodic signal of the at least one of the plurality of periodic signal generators by adjusting an increment value of the counter.

16. The method of claim 12, further comprising:
controlling a frequency of the periodic signal at the output of the at least one of the plurality of periodic signal generators, by controlling an order of the selection of the plurality of analog values stored in the at least one of the plurality of periodic signal generators.

17. The method of claim 16, wherein controlling the order of selection comprises directing each of a different plurality of subsets of counter bits to the switch control lines of the at least one periodic signal generator, and choosing one counter bit from each of the subsets.

18. The method of claim 17, wherein a size of the subsets determines a number of available frequencies that can be generated by the at least one periodic signal generator.

19. The method of claim 12, further comprising:
setting the analog values by setting a value of current for each of the plurality of analog values.

20. The method of claim 12, further comprising:
setting the analog values by setting a value of voltage for each of the plurality of analog values.

21. The method of claim 13, wherein frequency translation further comprises:
generating a phase-shifted reference clock from the reference clock;
generating a phase-shifted frequency switching local oscillator signal that is phase shifted relative to the frequency switching local oscillator signal;
frequency translating the phase-shifted reference clock with the phase-shifted frequency switching local oscillator signal;
generating a third frequency switching local oscillator signal by summing the frequency translated reference clock signal and the frequency translated phase-shifted reference clock.

22. The method of claim 21, wherein the phase-shifted frequency switching local oscillator signal is generated by a second plurality of periodic signal generators.

23. A frequency switching local oscillator, comprising:
a fixed-frequency reference clock for providing a clock reference signal;
a counter, the counter receiving the reference signal, and controlling cyclical selection of a one of a plurality of analog values stored in a periodic signal generators, the cyclical selection producing a periodic signal at an output of the periodic signal generators, the periodic signal generator storing N/4 samples of N samples of one period of the periodic signal, and generating the N samples of the periodic signal by the counter controlling selection of the stored values in an appropriate order and inverting every other repetition of N/2 samples;

means for controlling a frequency of the periodic signal at the output of the periodic signal generator by controlling an order of the selection of the plurality of analog values stored in the periodic signal generators;

means for generating a frequency switching local oscillator signal based on the periodic signal.

* * * * *